United States Patent
Moutel et al.

(10) Patent No.: US 8,555,496 B2
(45) Date of Patent: Oct. 15, 2013

(54) METHOD FOR MANUFACTURING AN ELECTRONIC KEY WITH USB CONNECTOR

(75) Inventors: Francois Moutel, Saint Zacharie (FR); Joel Barrier, Le Beausset (FR); Thierry Karlisch, La Ciotat (FR); Pierre-Andre Collet, Grenoble (FR)

(73) Assignee: Gemalto SA, Meudon (FR)

( * ) Notice: Subject to any disclaimer, the term of this patent is extended or adjusted under 35 U.S.C. 154(b) by 320 days.

(21) Appl. No.: 10/577,554

(22) PCT Filed: Oct. 4, 2004

(86) PCT No.: PCT/EP2004/052423
§ 371 (c)(1),
(2), (4) Date: Aug. 9, 2007

(87) PCT Pub. No.: WO2005/041120
PCT Pub. Date: May 6, 2005

(65) Prior Publication Data
US 2008/0092381 A1     Apr. 24, 2008

(30) Foreign Application Priority Data

Oct. 28, 2003   (FR) .................................. 03 12584

(51) Int. Cl.
*H01R 43/00*   (2006.01)
*H05K 13/00*   (2006.01)

(52) U.S. Cl.
USPC .................................. 29/854; 29/829; 29/874

(58) Field of Classification Search
USPC ............ 29/854, 829, 874, 877; 361/752, 756, 361/785, 791; 439/79, 131, 377, 660
See application file for complete search history.

(56) References Cited

U.S. PATENT DOCUMENTS

| 6,159,770 A   * | 12/2000 | Tetaka et al. .................. 438/112 |
| 6,676,419 B1  * | 1/2004  | Lin et al. ....................... 439/76.1 |
| 6,744,634 B2  * | 6/2004  | Yen ................................ 361/752 |
| 2003/0100203 A1 | 5/2003 | Yen |
| 2003/0140487 A1 | 7/2003 | Plettner |

FOREIGN PATENT DOCUMENTS

| DE | 202 12 256 U1 | 11/2002 |
| FR | 2 830 107     | 3/2003  |
| WO | 03/027946 A1  | 4/2003  |

* cited by examiner

*Primary Examiner* — Thiem Phan
(74) *Attorney, Agent, or Firm* — Buchanan Ingersoll & Rooney PC

(57) ABSTRACT

The invention relates to a method for manufacturing a USB electronic key, whereby a chip is cut out of a tape, provided with a plurality of chips, each chip defining contact pads in USB format and supporting an electronic component, connected to the pads. The thickness adjustment step is directly carried out on the chip to give a thickness conforming to the USB standard, at least in the area of the contact pads.

20 Claims, 2 Drawing Sheets

METHOD FOR MANUFACTURING AN ELECTRONIC KEY WITH USB CONNECTOR

This disclosure is based upon French Application No. 0312584 filed Oct. 28, 2003 and International Application No. PCT/EP2004/052423, filed Oct. 4, 2004, the contents of which are incorporated herein by reference.

BACKGROUND OF THE INVENTION

The invention relates to a method for manufacturing an electronic device in the form of a Universal Serial Bus (USB) electronic key or "dongle". The invention also relates to the structure of such a key.

USB keys are designed to be connected to a USB peripheral port of telecommunications equipment such as a personal computer (PC). The field of use is as vast as the field of use for smart cards (cards with chips) or/and for card readers or card drives (making data secure, Internet access, ID, e-commerce, payment on-line, cryptography, etc.).

Currently sold USB keys are relatively costly and their graphics and software customization remains limited. Such a key is equipped with a standard USB connector, with a mechanical and electronic interface, and with an outer housing making it possible to protect the system and to hold the system together mechanically.

Certain keys require a Subscriber Identity Module (SIM) or a Security Access Module (SAM) to be inserted into them in order for them to operate. The user can then insert the key into a PC or into any other equipment that can receive a USB connector (printers, personal data assistants (PDAs), etc.).

SUMMARY OF THE INVENTION

In general, a key of the invention includes a portion that is inserted into the port of the equipment and a portion that remains outside the port, and outside the trim or cowling of the equipment so that it can be handled.

Patent Application PCT/FR 02/03247 describes a method for manufacturing a USB electronic key wherely a module having contact pads compatible with the USB format is cut out from a smart card, and then its thickness is adjusted, at least in the area of the contact pads, so as to have thickness complying with the USB Standard.

FIG. 1 shows the smart card obtained using the above method and from which the electronic key 5 is cut out. The key has a front portion 51 designed to be inserted into the USB port of communications equipment. This portion is provided with a microcircuit having linear contact pads 28 and an electronic chip disposed underneath said pads and connected thereto. The key also has a rear portion 52 designed for being taken hold of. At this stage, the key is almost surrounded by a partial pre-cutout 53 except for bridges connecting it to the card body 27.

That method suffers from the drawback of offering few possibilities as regards the number and the sizes of the chips and/or of the components. The key serves to perform numerous applications and more sophisticated security functions that take up memory space. It is therefore necessary to have more memory available or a larger number of components, and to be able to protect them mechanically.

Among the keys currently on the market, there exist keys having a printed circuit carrying surface mount components (SMCs) and to which contact or connection studs are soldered or otherwise bonded. The resulting assembly is disposed in a bottom plastics shell, and a top plastics shell covers the integrated circuit except for the ends of the contact blades. That method suffers from the drawback of being costly.

An object of the present invention is to solve those drawbacks by implementing certain chosen steps of the method for manufacturing a smart card that are associated with other complementary existing steps.

In particular, the invention provides a method for manufacturing a USB electronic key, wherely a microcircuit is cut out from a flexible tape having a plurality of microcircuits, each microcircuit defining USB-format contact pads and carrying at least one electronic component connected to the pads.

The expression "USB-format contact pads" is used to mean contact pads whose shape complies with the USB format or is compatible with the USB format.

The method is distinguished in that, in a single operation, the thickness of the microcircuit is adjusted at least at its contact pads, directly starting from the microcircuit, so as to have a thickness that complies with the USB Standard.

Compared with the above-mentioned prior art, it is possible to avoid the step of inserting the microcircuit into a card body having the standard ISO format that is overdimensioned relative to the final dimensions of the key, and it is also possible to avoid subsequent cutting up of the card body in order to extract a key blank therefrom.

Adjustment of the thickness to about 2 mm takes place directly on the microcircuit without needing to go via a step of making a support card body to the standard smart card thickness (0.76 mm). This adjustment procures a key that is immediately usable in a device having a USB connector complying with the current standard.

The invention is also distinguished in that:
- the adjustment is achieved by a casing comprising at least one bottom half-shell disposed at least under the contact pads;
- the bottom half-shell is interfitted with a top half shell covering a zone of the microcircuit that lies outside the contact pads;
- the adjustment is achieved by inserting the microcircuit into a shell having an access on a rear edge;
- the adjustment is achieved by forming an overmolded portion over the microcircuit;
- the microcircuit is fastened to the bottom shell;
- the microcircuit is fastened by adhesive bonding or by being tight-fitting in the width direction at least in the area of the contact pads;
- the electronic component is disposed at a location remote from a location vertically in register with the contact pads; and
- the electronic component is disposed on the same side of the microcircuit as the contact pads.

The invention also provides an electronic key including a microcircuit defining USB-format contact pads and carrying an electronic component connected to the pads, and having the contact pads disposed on a dielectric.

Depending on the implementation of the method used, the electronic key has:
- its thickness adjusted by an overmolded portion of a single homogenous material that is overmolded directly over the microcircuit, at least in the area of the contact pads, so that its microcircuit thickness complies with the USB Standard; or
- has its microcircuit thickness adjusted by a bottom shell, at least in the area of the contact pads, so that its microcircuit thickness complies with the USB Standard.

The bottom half-shell is interfitted with a top half-shell which covers a zone of the microcircuit that lies outside the contact pads.

The key has an access on one of its front, side, or rear edges, the shell of the key being made in one piece.

The thickness adjusted on the microcircuit in a single operation is greater than 1.5 mm and less than about 2 mm depending on the dimensions of the tape.

By means of the characteristics of the invention, it is possible to have a greater choice as regards the number and dimensions of the electronic components, and the positioning of the electronic components. This can be explained by the presence of a greater thickness under the contact pads in the USB format than in the standard smart card (respectively 2 mm as against 0.76 mm).

The invention also offers the advantage of there being an absence of positioning constraints for the component that is substantially in a centered position under the contact pads in a typical smart card two-stage cavity.

The invention is also less limited as regards component size because a shell of larger volume provides mechanical protection for the components.

The use of a shell in two portions, namely a bottom and a top portion enables, in particular, one or more components to be positioned on one face and/or the other face of the microcircuit and if necessary in a manner offset relative to a location vertically in register with or facing the contact pads. A very wide range of shapes can be considered for performing the functions required of a USB key.

BRIEF DESCRIPTION OF THE DRAWINGS

Other features and advantages of the invention appear clearly on reading the following description given by way of non-limiting example and with reference to the accompanying drawings, whereby.

DETAILED DESCRIPTION

Figure 1:
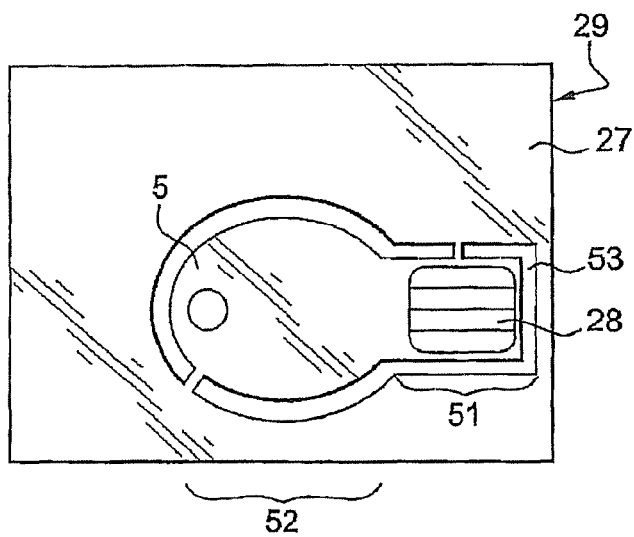
FIG. 1, described above, diagrammatically shows a prior art smart card of standard ISO format and from which a USB key is extracted.
Figure 2:
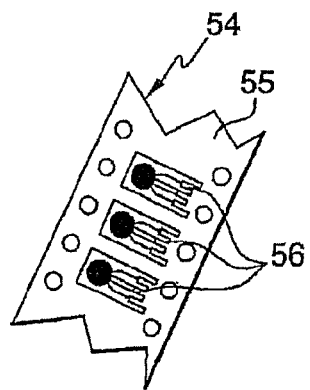
FIG. 2 is a plan view of a tape used by the method for the invention and carrying the microcircuits.

As shown in FIG. 2, the method for manufacturing a USB electronic key comprises a step which starts from a continuous tape 54 such as the tape used in the field of smart cards, of the LFCC or MCTS type. The tape in the example is constituted by a dielectric backing film 55 carrying a series of microcircuits 56, each of which has conductive patterns. The patterns represent contact pads 57, conductive tracks 58 extending the pads to a location situated behind the microcircuit opposite from the contact pads. An electronic chip is fastened to said location and its tabs are connected electrically to the tracks via connection wires. Any other connection means known in the smart card field can be suitable.

Protection 59 in the form of a deposit of a drop of insulating resin covers the assembly formed by the chip and by the connection wires.

By way of an alternative, the tape can be totally in the form of a fine metal screen wherely the patterns are partially precutout.

Even in its combined dielectric/metal-plated surface or in its metal-only version, the tape has a total thickness that is generally smaller than the thickness of a printed circuit. The dielectric is, for example, a polyimide film. It is in the form of a continuous tape that can be wound onto reels and that is preferably provided with side perforations for driving it.

As in smart card technology, the method thus implements the same tape, and the following steps: defining contact pads and optionally conductive tracks, fastening the chip, connection, or indeed electrical testing and extracting the microcircuit by cutting out.

Figure 3:
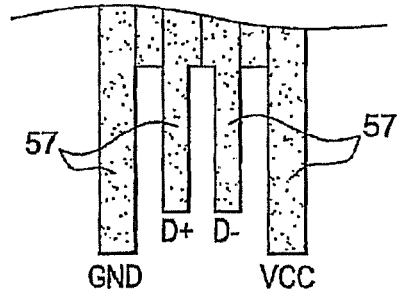
FIG. 3 is a fragmentary view of the USB-format contact pads of a microcircuit designed to be connected to a USB-type port.

As shown in FIG. 3, the contact pads of the microcircuit are defined in a manner such as to correspond to the electrical connection tabs of a USB-type port; namely a VCC one for current feed, a GND other one for grounding, and the other two for data communications. These contact pads then advantageously replace the standard USB connector or metal contacts soldered or otherwise bonded to a printed circuit of the above-mentioned prior art.

Figure 4:
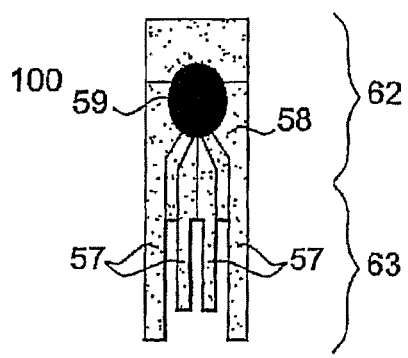
FIG. 4 is a diagrammatic plan view of a microcircuit after cutting out.

FIG. 4 shows a microcircuit which has been extracted by being cut out from the tape 54. It has a chip disposed on the top face of the microcircuit (the face visible in FIG. 4) and covered with a coating.

Figure 5:
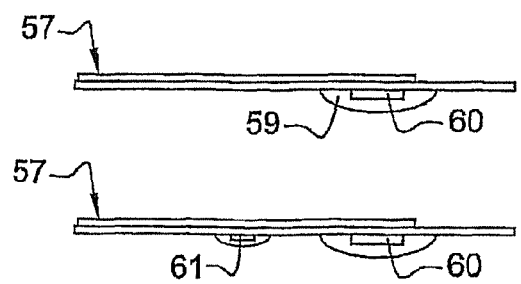
FIG. 5 is a diagrammatic side view of two different microcircuits after cutting out.

In FIG. 5, it can be seen that the microcircuit has received an integrated-circuit chip 60 or a plurality of integrated-circuit chips 60, 61. Where applicable, other chips or electronic components that are juxtaposed or superposed can be disposed over the entire surface of the module except for the top faces of the contact tabs that are deigned to penetrate into a USB connector and to establish electrical contact therewith. The largest-size main chip is preferably disposed on a zone offset towards the rear of the key in the direction opposite to the direction whereby the key is inserted. Said rear portion 62 corresponds normally to the graspable portion of the key, i.e. that portion which can be taken hold of, or to that portion of the key which projects from the USB port of equipment. The chips in this figure are disposed on the bottom face of the microcircuit but they can be disposed on the top face on the same side as that face of each of the contact pads which establishes the electrical contact.

The cut-out microcircuit has a thickness of about 0.16 mm in the area of the contact pads. This thickness is too small for it to be possible for the contact pads to be in contact with the electrical connection tabs of a USB port 65 when the key is inserted therein. Ideally, the thickness of the microcircuit should be 2 mm.

In order to remain within the context of a standard method for manufacturing the smart card so as not to require costly special tools to be developed, once the microcircuit has been isolated from the tape, its thickness is then adjusted, at least over the portion that penetrates into a USB port in the area of the contact pads, to a thickness complying with the USB Standard.

Figure 6:
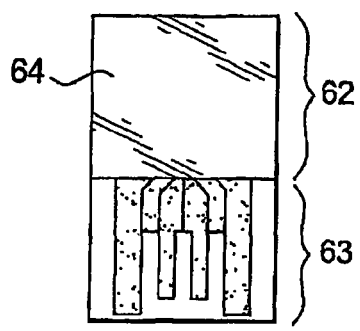
FIG. 6 diagrammatically shows a key obtained using a first implementation of the method.

A very simple solution consists in having a plastics portion situated at the ends of the contacts of the microcircuit over a portion 63 shown in FIG. 6 and designed to penetrate into a USB port of external equipment.

To this end, a packaging operation for packaging the microcircuit is performed, and it can be performed in various manners described below.

Figure 7:
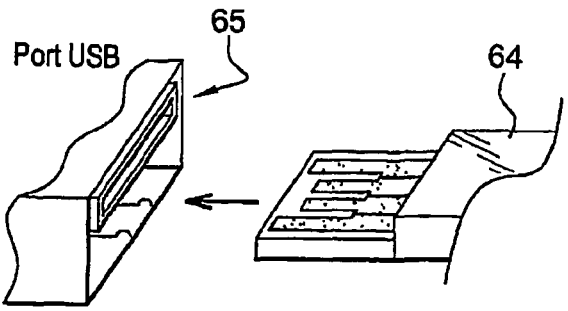
FIG. 7 diagrammatically shows how a USB key of the preceding figure is inserted into a USB port of communications equipment.

It is possible to overmold a plastic over the entire microcircuit except for the contact pads, as shown in FIGS. 6 and 7, so as to leave the contact pads exposed at the surface of the key 101. Preferably, the pads are at the same level as the surface of the overmolded plastic. For example, the level of the pads is at the same level as the overmolded surface plus or minus 100 μm. In the example, a thickness adjustment of 1.84 mm is achieved in one thickness adjustment operation.

The rear of the key has an overmolded portion of extra thickness that forms a shoulder 64 relative to the contact pads and that covers the tracks and the components.

In a version that is not shown, the overmolding is performed only over the front of the key in the area of the contact pads (and not over the tracks or over the location of the chip). The overmolded portion obtained makes it possible to set once and for all the standardized portion of the key. Optionally, the overmolded portion is suitable for subsequently receiving a trim-forming covering or casing forming the body of the key (such as a plastics shell) and/or customization chosen by the customer or by the distributor. To this end, the trim-forming covering can be provided with any mechanical fastening means for fastening it to the overmolded portion, namely, a clip, a transverse groove, etc.

The portion resulting from the overmolding and referred to as the "overmolded portion" can also extend to the rear of the key so as to stiffen and/or to package and/or to protect any components disposed on the rear portion.

All or part of the overmolded portion can optionally be formed on the tape before the microcircuit is cut out. In particular, it is possible to use continuous overmolding technology by extrusion for the bottom portion. Then, the portion 64 can be overmolded locally in an injection mold.

Figure 8:
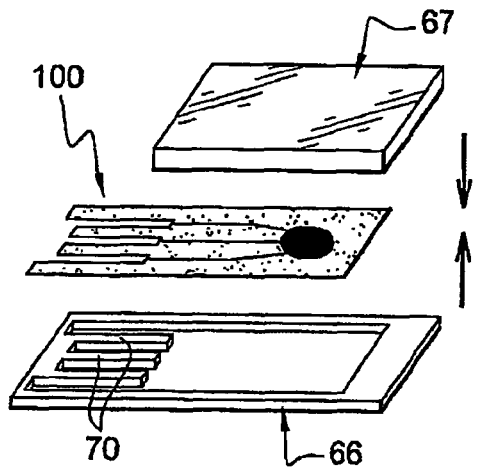
FIGS. 8 and 9 diagrammatically show a key obtained using a second implementation of the method.
Figure 9:
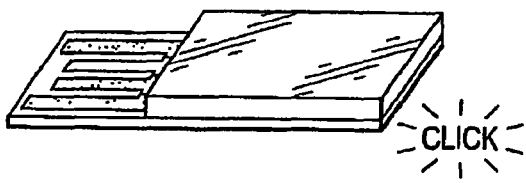

In a variant shown in FIG. 8, the adjustment is performed by a casing formed by a bottom half-shell 66. In this case, the chip is disposed on the same side as the conductive tracks. At one of its ends, the shell can be provided with parallel grooves corresponding to the linear contact pads of the microcircuit.

A top half-shell 67 can be disposed on the rear of the key, over a zone 62 of the microcircuit that lies outside the contact pads so as to cover the chip and the coating 59. The half-shell 67 fits, by any suitable fastening means, onto a bottom half-shell 66 that covers the bottom face of the microcircuit. The shells, which are generally made of ABS or polycarbonate materials, can be assembled together in particular by clipping, adhesive bonding, ultrasound welding or sealing, screws, etc.

When the microcircuit does not include a chip on the same side as the contact pads or on the same side as the tracks, the method and the key can omit fastening of the top shell 67. The microcircuit can be merely fastened by adhesive bonding in the half-shell 66. As an alternative to adhesive bonding, with the pads being teeth-shaped or comb-shaped, it is possible the microcircuit to fit tightly in the width direction into the shell at least in the area of the contact pads.

Figure 10:
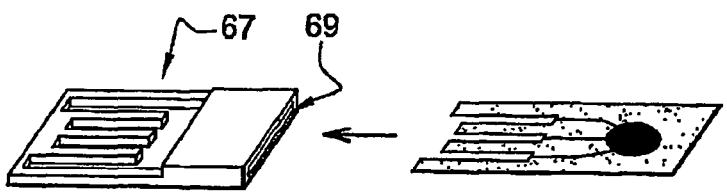
FIGS. 10 and 11 diagrammatically show a key obtained using a third implementation of the method.
Figure 11:
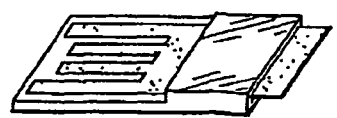

In a variant shown in FIGS. 10 and 11, the adjustment is achieved by means of a one-piece shell 68 whose overall shape is equivalent to the resulting shape of the casing formed by the two preceding shells 66 and 67 but that, in addition, is provided with a lateral insertion slot 69 in a rear edge. It suffices to insert the microcircuit via the rear of the shell in order to achieve the thickness adjustment. When the electronic components are disposed under the contact pads, it is preferable not to perforate or to cut the dielectric film that supports the contact pads. It is also preferable to have a shell presenting a microcircuit-receiving space that is not provided with grooves 70.

In the invention, even in the combined dielectric/metal-plated surface or in the metal only version, said tape has a total thickness that is generally 3 times smaller than the thickness of a printed circuit without the components.

The dielectric is, for example, a polyimide film. It is in the form of a tape that is suitable for being wound onto reels and that is preferably provided with side perforations for driving it. A priori, dielectrics of printed circuit boards (PCBs) in particular that are made of bakelite, epoxy, and Teflon, that are thicker, and that do not lend themselves to smart card technology are excluded from the invention. In particular, printed circuits reinforced with glass fiber and that cannot be wound onto reels are excluded.

By way of example, it is possible to use a tape having a dielectric having a thickness of 75 μm and adhering by means of a thickness of 15 μm of adhesive to metal plates that are 70 μm in thickness. In another example, wherely the drive side perforations are in the dielectric, the thicknesses of the dielectric, of the adhesive, and of the pads are respectively 120 μm, 15 μm, and 35 μm.

Preferably, the dielectric has a thickness less than or equal to 200 μm.

In the example, adding an integrated circuit chip and coating to the microcircuit brings the microcircuit to a total thickness less than or equal to 630 μm at the level of the components, unlike with PCB technology.

In addition, the connections of the components can be established via conductor wires or via conductive adhesive, in particular when the chips are mounted with the connection tabs facing towards the conductive surfaces, i.e. when they are flip-chips (chips mounted upside down).

The components can be in the form of integrated circuit chips, bonded with adhesive to the dielectric or metal surface of the tape, and, preferably, the chip and its connections are then coated with a drop of insulating resin. The resin fits snugly over the chip, and the connections are visible and extend onto a portion of its support around the chip. If necessary, the bulge of resin formed over the chip by the resin is planed down in order to reduce its thickness.

Finally, a microcircuit that is compact is obtained that uses all or some of the above smart card technology so as to present the above-mentioned advantages.

In a variant, the key of the invention is designed on the basis of a module using smart card technology (except for the contact pads which are in USB format) and of a shell (support).

The module comprises a dielectric film covered with contact pads, and a chip disposed vertically below the contact pads and/or the film. This shell is preferably directly in the final shape of the key with, in particular, rearwardly convex shapes facilitating handling or contributing to pleasing appearance.

The shell has a front portion, at the connection, which portion is suitable for receiving the module in a conventional smart card insertion operation. The front portion is provided with a cavity for receiving the module.

The contact pads of the module can preferably be at the same level of the surface of the shell at the front of the shell or support. The shell can have two stages: a top stage for receiving the dielectric and the contact pads and a bottom stage for receiving the chip, the connections and the coating. The thickness of the front portion corresponds substantially to a standard USB-key thickness, in principle greater than the standard smart card thickness (0.76 mm). The insertion can be achieved by means of an adhesive disposed between the top plane and the module. The adhesive can, for example, comprise drops of adhesive or a film of the thermo-adhesive type.

Finally, in order to complete the key, it is possible to dispose a metal frame or ring provided with top openings that come to be fastened around the front portion of the shell. The front portion of the shell can be provided with means for removably fastening a protective cap.

The invention claimed is:

1. A method for manufacturing a USB electronic key, comprising cutting out, from a dielectric backing film which has a thickness of less than or equal to 200 µm and carries a plurality of microcircuits, a portion of the dielectric backing film including one of the microcircuits, each microcircuit defining USB-format contact pads and carrying an electronic component connected to the pads; and, in a single operation, increasing the thickness of the cut-out portion of the dielectric backing film including the one of the microcircuits at least in the area of the contact pads of the one of the microcircuits, so as to have a thickness that conforms to the USB Standard.

2. The manufacturing method according to claim 1, wherein the increasing comprises disposing a casing comprising at least one bottom half-shell at least under the contact pads.

3. The manufacturing method according to claim 2, further comprising interfitting the bottom half-shell with a top half-shell covering a zone of the microcircuit that lies outside the contact pads.

4. The manufacturing method according to claim 2, further comprising fastening the microcircuit to the bottom half-shell.

5. The manufacturing method according to claim 4, wherein the fastening is by adhesive bonding or by tight-fitting cross-wise at least.

6. The manufacturing method according to claim 1, wherein the increasing comprises inserting the microcircuit into a shell having an access on a rear edge.

7. The manufacturing method according to claim 1, wherein the increasing comprises forming an overmolded portion over the microcircuit.

8. The manufacturing method according to claim 1, wherein the electronic component is disposed at a location offset from a location of the contact pads.

9. The manufacturing method according to claim 1, wherein the electronic component is disposed on the same top face of the microcircuit as the contact pads.

10. A method for manufacturing a USB electronic key from a dielectric backing film which carries a microcircuit, the microcircuit defining USB-format contact pads and carrying an electronic component connected to the pads, the method comprising, in a single operation, increasing the thickness of the dielectric backing film including the microcircuit at least in the area of the contact pads of the microcircuit, so as to have a thickness that conforms to the USB Standard, wherein the increasing comprises disposing at least the contact pads in a cavity of a casing having a bottom half-shell and a to half-shell, the cavity in which at least the contact pads are disposed being formed in the bottom half-shell of the casing.

11. The manufacturing method according to claim 10, wherein comprises interfitting the bottom half-shell with the top half-shell to thereby cover the bottom-half shell only on a side opposite a side of the bottom-half shell which contains the contact pads such that a maximum height of the casing at the side at which the contact pads are disposed is less than a maximum height of the casing at the opposite side at which the top-half shell covers the bottom-half shell.

12. The manufacturing method according to claim 11, further comprising fastening the microcircuit to the bottom half-shell.

13. The manufacturing method according to claim 12, wherein the fastening is by adhesive bonding or by tight-fitting cross-wise at least.

14. The manufacturing method according to claim 10, wherein the increasing further comprises inserting the microcircuit into an access on a rear edge of the casing.

15. The manufacturing method according to claim 10, wherein the increasing further comprises forming an overmolded portion over the microcircuit.

16. The manufacturing method according to claim 10, wherein the electronic component is disposed at a location offset from a location of the contact pads.

17. The manufacturing method according to claim 10, wherein the electronic component is disposed on the same top face of the microcircuit as the contact pads.

18. The manufacturing method according to claim 10, wherein the dielectric backing film has a thickness of less than or equal to 200 µm.

19. A method for manufacturing a USB electronic key from an insulating substrate which carries a microcircuit, the microcircuit defining USB-format contact pads and carrying an electronic component connected to the pads, the method comprising, in a single operation, increasing the thickness of the insulating substrate including the microcircuit at least in the area of the contact pads of the microcircuit, so as to have a thickness that conforms to the USB Standard, wherein the increasing comprises disposing at least the contact pads in a cavity of a casing having a bottom half-shell and a to half-shell, the cavity in which at least the contact pads are disposed being formed in the bottom half-shell of the casing.

20. A method for manufacturing a USB electronic key from a dielectric backing film or insulating substrate which carries a microcircuit, the microcircuit defining USB-format contact pads and carrying an electronic component connected to the pads, the method comprising disposing a bottom-half shell and a top-half shell of a casing at the dielectric backing film or insulating substrate such that the bottom-half shell is below the dielectric backing film or insulating substrate and the top-half shell is above the dielectric backing film or insulating substrate, to thereby increase the thickness of the dielectric backing film or insulating substrate at least in the area of the contact pads of the microcircuit, wherein the top-half shell covers only one side of the bottom-half shell opposite a side at which the contact pads are disposed such that a maximum height of the casing at the side at which the contact pads are disposed is less than a maximum height of the casing at the opposite side at which the top-half shell covers the bottom-half shell.

* * * * *